United States Patent [19]

Kroll et al.

[11] Patent Number: 4,981,564

[45] Date of Patent: Jan. 1, 1991

[54] ADDITIVES FOR ELECTROPLATING COMPOSITIONS AND METHODS FOR THEIR USE

[75] Inventors: Harry Kroll, East Greenwich; Florence Butler, Smithfield; Therese R. Souza, Cranston, all of R.I.

[73] Assignee: Technic Inc., Cranston, R.I.

[21] Appl. No.: 519,882

[22] Filed: May 7, 1990

Related U.S. Application Data

[63] Continuation-in-part of Ser. No. 215,749, Jul. 6, 1988, Pat. No. 4,923,576.

[51] Int. Cl.$^5$ ............................ C25D 3/56; C25D 3/60
[52] U.S. Cl. ................................................. 204/44.4
[58] Field of Search ............................ 204/44.4, 54.1

[56] References Cited

U.S. PATENT DOCUMENTS

| | | | |
|---|---|---|---|
| 2,457,152 | 12/1948 | Hoffman | 204/54 |
| 4,000,047 | 12/1976 | Ostrou | 204/53 |
| 4,139,425 | 2/1979 | Eckles | 204/53 |
| 4,459,185 | 7/1984 | Obata et al. | 204/53 |
| 4,871,429 | 10/1989 | Nobel et al. | 204/44.4 |
| 4,923,576 | 5/1990 | Kroll et al. | 204/44.4 |

FOREIGN PATENT DOCUMENTS

| | | |
|---|---|---|
| AO 172267 | 8/1984 | European Pat. |
| AO 192273 | 2/1986 | European Pat. |
| 156490 | 6/1989 | Japan . |

OTHER PUBLICATIONS

*Chemical Abstracts*, Vol. 106, Apr. 1987, p. 515, Abstract No. 110014x (A Kostash, et al.).
*Chemical Abstracts*, Vol. 110, 1989, p. 560, Abstract No. 143504t (S Lahiri, et al.)

*Primary Examiner*—G. L. Kaplan
*Attorney, Agent, or Firm*—Ostrolenk, Faber, Gerb & Soffen

[57] ABSTRACT

Heteroaromatic compounds having at least two nitrogen atoms may be used to regulate consistency of alloy content and of deposit thickness. Modified nonionic surfactants which lack terminal hydroxy groups are used as grain refiners having low tendency to cause foam build-up in electroplating baths. Dioxolanes may be used to produce deposits having, as desired, a white uniform matte, a semi-bright plate, or a mirror bright surface. Antioxidants are used to prevent oxidation of divalent tin.

19 Claims, No Drawings

ADDITIVES FOR ELECTROPLATING COMPOSITIONS AND METHODS FOR THEIR USE

RELATED APPLICATION

This application is a continuation-in-part of U.S. patent application Ser. No. 07/215,749 filed Jul. 6, 1988 and now U.S. Pat. No. 4,923,576.

BACKGROUND OF THE INVENTION

Field of the Invention

This invention relates to additives for electroplating baths which enhance the quality of electroplated products and improve the efficiency and safety of the electroplating process. In particular, the invention relates to additives which suppress the build-up of foam in the electroplating bath during mass production, and to additives which control the thickness and content of the deposit over a wide range of current densities, and to additives which act as brighteners.

This invention also relates to additives for electroplating baths which prevent the oxidation of divalent tin in the baths, but yet not adversely affect the grain boundaries of the plated metal or alloy.

The additives are particularly useful, for instance, in alloy systems such as a tin/lead electroplating bath.

Automatic plating lines for printed circuit boards and connectors have introduced new requirements into the properties of industrial electroplating baths. This is especially true, for instance, for solutions used in producing alloy deposits such as a tin/lead alloy in a continuous on-line mode. A typical apparatus for conducting such electroplating consists of a reservoir holding the plating solution, a tank where the electroplating is done, and a pump which propels the plating solution from the reservoir to the plating tank. The plating solution is usually returned to the reservoir to complete a circuit. Work pieces may be moved through the plating tank on a conveyor belt at a regulated speed and at a current density commensurate with the acceptable alloy deposit.

For economic reasons, the automatic line carrying the work pieces should preferably move at a high speed and at elevated current densities. When work pieces are moving through the system at such a high rate, the plating solution should preferably be pumped rapidly through the system as well. Such high speed pumping agitates the solution and, due to the prior art additives used in the bath, may generate undesirably high quantities of foam. For instance, commercial tin/lead electroplating solutions formulated in recent years usually contain nonionic surfactants based on polyethylene oxide, and/or poly(ethylene/propylene) oxide copolymers. These surface active agents act as grain refiners and wetting agents. However, solutions containing such nonionic surfactants may build up stable foams in undesirable quantities when subjected to the aeration and agitation that is common in most high-speed commercial mass production systems.

In an automatic plating line, the usual pumping action so agitates the plating solution that foam is generated to an extent capable of overflowing the holding tank. This may result in an economically detrimental loss of plating solution. Such foaming and loss of plating solution may be reduced by slowing down the plating process, but at the expense of lost productivity. Prior art attempts to solve the foaming problem without reducing speed have included addition of anti-foaming agents which, while effective in reducing foam, may undesirably introduce impurities into the deposit.

During electroplating, the work pieces may have variations in current density along their platable surfaces due to variations in surface geometries and the like. This may cause variations in the depth of the deposited plate, or in some instances involving alloys, variations in the ratios of metals deposited in the plate. For instance, in tin/lead electroplating, higher lead content may be observed in areas having low current density relative to areas having higher current density. Many articles, such as printed circuit boards, go through a fusion or reflow process after alloy plating. During this process, dissimilarities in alloy composition may produce an undesirable roughness in the fused coatings. Also, areas of high current density during electroplating will tend to have deposit thicknesses greater than those of low density areas. These differences in thicknesses are inappropriate in many contexts.

U.S. Pat. No. 4,000,047 discloses a bath for electrodeposition of bright tin/lead alloys having, among other things, certain specified pyridines and quinolines. U.S. Pat. No. 4,388,161 discloses preparation of bright tin/lead alloy deposits by electrocoating using a bath having, among other things, certain halomethyl substituted dioxolanes which are further substituted by a specified phenyl, naphthyl or pyridyl radical.

In U.S. Pat. No. 4,555,314, long chain alkyl guanamines are disclosed for regulating tin/lead ratios during electrodeposition of tin/lead alloys. U.S. Pat. No. 4,565,609 describes the use of high molecular weight quaternized 2-alkyl imidazolinium salts for similar purposes. U.S. Pat. No. 4,459,185 discloses the use of high molecular weight cationic compositions in conjunction with amphoteric surfactants as regulators. There remains a need, however, for more effective regulators for maintaining more consistent alloy content and coating thickness along the surface of the platable materials. A difficulty in the prior art has been finding additives to regulate both thickness of alloy deposit and ratio of metal concentrations in alloy at low additive concentrations such that the additives do not contribute significantly to occluded carbon content of the deposit.

In some products, electrodeposited alloy may be subjected to a high temperature flow or fusion process capable of converting solder plate into a smooth bright coating. However, use of such a fusion process may be inappropriate for many electrical and electronic components including those electroplated with various alloys. To produce a bright electrodeposit on these products, selected additives must be formulated into the bath. Prior art additives for these purposes include numerous aldehydes such as formaldehyde, acetaldehyde, 3-hydroxy butyraldehyde, and chloro-substituted aromatic aldehydes. Although blends of these compounds are effective in producing a bright finish, they are also quite volatile and, under conditions of the plating operation, concentrations sufficient to constitute a health hazard may accumulate in the immediate environment.

In addition to the foregoing, the ready oxidation of divalent tin to the tetravalent state by atmospheric oxygen is well recognized in those applications where stannous tin is electrodeposited on a substrate in a variety of technical applications. The formation of metastannic acid and its derived products by the aerobic and anodic oxidation of stannous tin introduces a serious problem in the functioning of tin and tin alloy electroplating baths. This is manifested by the formation of colloidal and opalescent solutions which lead to the formation of sludges that have to be removed by continuous filtration. The maintenance of filtering systems and the disposal of appreciable quantities of sludge containing toxic metal residues represents a serious industrial problem.

It is well known in the prior art that the oxidation of divalent tin in electroplating baths can be inhibited and substantially reduced by the use of antioxidants. Among those commonly used are the dihydric phenols, i.e., hydroquinone, catechol, and resorcinol. In U.S. Pat. No. 4,871,429 resorcinol and certain other hydroxyphenol compounds are used to suppress formation of tetravalent tin. Other antioxidants that have been mentioned for this use are the substituted 1,4-phenylene diamines and the 4-(N-alkylated) aminophenols. Although all of the above compounds function as acceptable antioxidants for these baths, they may have adverse effects on the physical characteristics of the deposited coating.

In the fabrication of printed circuit boards, connectors, and other electronic devices, a matte or semi-bright deposit of a tin lead alloy is required. The end use requirements of the devices frequently dictates the physical properties of the tin or tin lead alloys electrodeposited on the work pieces. For the most part, the nature and shape of the metallic grains deposited on the surface and its boundaries determine the physical properties of the composite surface. These in turn determine the functional applicability of the electrodeposited coatings for their end use.

Although the polyhydric phenols, mentioned above, act as antioxidants for stannous tin, they have undesirable properties of adversely affecting the grain boundaries of the plated metal or alloy. This effect can be studied by scanning electron microscopy. Under these magnifications, the deposited metal is composed of relatively large granules having an irregular surface of many high and low areas.

OBJECTS OF THE INVENTION

It is accordingly an object of the present invention to provide an improved electroplating process for mass production of work pieces at high speed with minimal loss of electroplating solution.

It is another object of the invention to effectively regulate thickness of deposit and/or metal concentration of an alloy deposit with one or more additives held at low concentrations such that occluded carbon content of the deposit is not significantly affected.

It is another object of the invention to brighten the deposit resulting from the electroplating process without the use of highly volatile brighteners and without unacceptable environmental build-up of the brighteners.

It is a another object of the invention to reduce foam build up in electroplating baths used for commercial production.

It is a another object of the invention to reduce foaming without imparting impurities into the electroplate.

It is another object of the invention to reduce oxidation of divalent tin but not adversely affect the grain boundaries of the plated metal or alloy.

SUMMARY OF THE INVENTION

These and other objects are achieved by providing electroplating baths having one or more of the additives disclosed herein. Foaming may be reduced by including, as a grain refiner, a nonionic surfactant which has no terminal hydroxy groups. In preferred embodiments, such grain refiners are analogous to terminal hydroxy-containing nonionic surfactants, differing only in that the terminal hydroxy groups have been replaced or blocked. Deposit thickness and/or composition of deposited alloys may be regulated by low concentrations in the electroplating bath of deposit regulating agents comprising at least one heteroaromatic compound having at least two nitrogen atoms. It is desired that these regulating agents cause the electrodeposit to be more consistent throughout its surface area as to the relative metal content of the alloy, or the deposit thickness, or preferably both. Preferably, these deposit regulators are capable of forming chelates with heavy metal cations. Brightening may be accomplished by utilizing dioxolanes. The additives of the invention may be added directly to the plating bath or they may be dissolved in a suitable solvent for use as a vehicle to introduce the additive to the bath.

The brighteners, grain refiners and deposit regulators each contribute advantages to the electroplating process and/or the electroplated product. While they are preferably utilized concurrently in the same electroplating solution, this is not necessary.

The deposit regulating agents regulate alloy content and deposit thickness even if the only nonionic grain refiners are those of the prior art. That is, the deposit regulators of the invention are functional even in the absence of the anti-foaming grain refiners which lack terminal hydroxy groups. They are also functional in the absence of the dioxolanes of the invention.

Oxidation of divalent tin in the electroplating bath is reduced by including in the bath an effective amount of an antioxidant which is either hydroquinone sulfonate, 1-phenyl-3-pyrazolidinone or 4-alkylated 1-phenyl-3-pyrazolidinone. In preferred embodiments, the hydroquinone sulfonate is potassium or sodium hydroquinone sulfonate, the 1-phenyl-3-pyrazolidinone is combined with a dihydric phenol compound, preferably catechol, resorcinol or hydroquinone, and the 4-alkylated 1-phenyl-3-pyrazolidinone is either 1-phenyl-4-methyl-3-pyrazolidinone or 1-phenyl-4,4-methyl-3-pyrazolidinone.

Improved electroplating methods result from utilizing one or more of the additives disclosed herein. Consistent alloy composition and thickness may result from electroplating processes utilizing the deposit regulating agents of the invention. Oxidation of divalent tin is reduced without adversely affecting grain boundaries by electroplating processes utilizing the antioxidants of the invention.

DETAILED DESCRIPTION OF CERTAIN PREFERRED EMBODIMENTS

In preferred embodiments of the invention, the brightening agent, deposit regulator, and modified grain refiners are all used together in a commercial electroplating bath which is part of a continuous system. A preferred bath in accordance with the invention includes components for depositing a tin/lead alloy. For instance, such a bath may include water soluble tin and lead salts such as methane sulfonates or fluoroborates.

Common tin/lead electroplating baths may include tin methane sulfonate, lead methane sulfonate, and methane sulfonic acid. The concentration of tin in the bath, as stannous methane sulfonate for instance, preferably ranges from about five grams per liter to about 100 grams per liter. The lead content, as plumbous methane sulfonate for instance, preferably ranges from about 3 to about 60 grams per liter. Methane sulfonic acid concentration preferably ranges from about 5 to about 200 grams per liter.

In accordance with the invention, starting materials for forming the novel grain refiners of the invention may be nonionic surfactants such as those used in the prior art having the general formula:

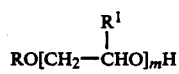

where R represents a $C_6$ to $C_{18}$ alkyl group; a $C_1$ to $C_{12}$ alkyl benzene, a beta-naphthalene nucleus, or a hydrogen atom; $R^1$ may be hydrogen or methyl, and m may be an integer between 3 and 30. These materials include a number of prior art nonionic surfactants which are used as grain refiners. While not intending to be bound by theory, it is believed that undesirable foaming characteristics associated with these prior art materials may be caused by the terminal hydroxyl group of these compounds. In preferred embodiments of the invention, Applicants introduce, into plating baths, analogs of terminal hydroxy-containing nonionic surfactants wherein the terminal hydroxyl group has been blocked or eliminated. It has been found that foaming of the bath may be reduced by using these modified grain refiners in place of, or in addition to, conventional grain refiners.

Certain compounds useful as anti-foaming grain refiners in accordance with the invention are commercially available. They may also be prepared by a variety of known techniques. For instance, known reactions involving hydroxyl group participation may be used to effect blocking or elimination of terminal hydroxy groups. Blocking or modification of the hydroxy group may, for instance, be accomplished by an etherifying radical, an acetalization of two hydroxy groups by low molecular aldehyde, or replacement of the hydroxy group by halogen.

Preferred anti-foaming nonionic grain refiners in accordance with the invention include, but are not limited to, those represented by the structural formula:

where R, $R^1$, and m have the same designations indicated above and X may be a halogen, alkoxy or aralkoxy.

Another valuable modified nonionic grain refiner useful in accordance with the invention belongs to the group where the terminal hydroxy groups have been reacted with a low molecular weight aldehyde to form an acetal. Preferred compounds of this class have the general formula:

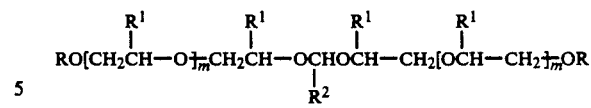

where R, $R^1$ and m have the designations indicated above and $R^2$ may be hydrogen, a $C_1$ to $C_4$ alkyl group, $CH_3CHOHCH_2$-phenyl or halogenated phenyl. These compounds may be synthesized in the laboratory by known methods. Some are commercially available.

Nonionic surfactants useful as anti-foaming grain refiners in accordance with the invention are available from Rohm & Haas Company, Philadelphia, Pa., under the tradenames "TRITON CF-54", "TRITON DF-18", "TRITON D-18", and "TRITON D-16". GAF Chemicals Corp. of Wayne, N.J. offers a modified polyether under the tradename "ANTAROX F-330". PPG of Pittsburgh, Pa. has available a series of polyether surfactants bearing the tradename "AVANEL" in which the terminal hydroxy group has been replaced by halogen. The nonionic surfactant Triton CF-76 (Rohm and Hass) is a commercially available, modified nonionic of the acetal type.

Use of the grain refiners of the invention has been shown to result in electroplating baths which not only exhibit less initial foaming, but also exhibit faster subsidence of foam initially formed. These grain refiners are preferably added to an electroplating bath in a concentration between about 1.0 grams/liter and 15.0 grams/liter, and most preferably between about 3.0 grams/liter and 8.0 grams/liter.

Deposit regulating compositions in accordance with the invention comprise heteroaromatic compounds having at least two nitrogen atoms. Preferred regulators include, but are not limited to, phenanthrolines, quinolines, and pyridyl compounds having at least two nitrogen atoms. The concentrations of these compounds in the plating bath are preferably so low that they do not contribute to the occluded carbon content of the deposit. A preferred concentration in the plating bath is between about 0.001 grams/liter and about 1.0 grams/liter, most preferably between about 0.01 grams liter and about 0.5 grams/liter.

Preferred regulators display the beneficial unique property of forming strong chelates with copper, iron and other metal cations. Numerous species have proven effective in improving the plating characteristics of a tin/lead electroplating bath. Compounds useful as regulators include, but are not limited to, the following:

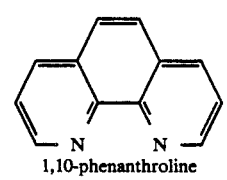

1. 1,10-phenanthroline

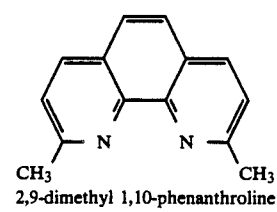

2. 2,9-dimethyl 1,10-phenanthroline

-continued

3. 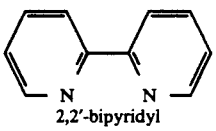
2,2'-bipyridyl

4. 
2,2'2''-terpyridyl

5. 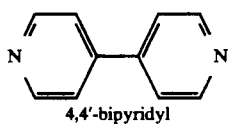
4,4'-bipyridyl

6. 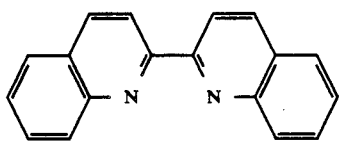
2,2''-diquinoline

7. 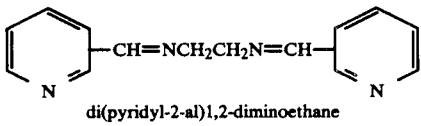
di(pyridyl-2-al)1,2-diminoethane

Dioxolane brighteners of the invention are effective without exhibiting the volatility and environmental pollution often associated with the prior art aldehydes used for this purpose. Preferred brighteners include but are not limited to those having the general formula:

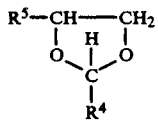

where R4 may be hydrogen, C1 to C4 alkyl, phenyl, or substituted phenyl. R5 may be hydrogen, methyl or hydroxymethyl. In certain preferred embodiments, R4 is hydrogen, methyl, propyl, phenyl or chlorophenyl.

Dioxolanes are preferably added to an electroplating bath at a concentration of about 0.05 grams/liter to about 50 grams/liter and most preferably about 0.1 grams/liter to about 20 grams/liter. Preferred dioxolanes include but are not limited to 1,3 dioxolanes, and substituted dioxolanes having as substituents methyl, hydroxymethyl and halophenyl groups.

Antioxidant compounds in accordance with the invention include: hydroquinone sulfonate (such as potassium or sodium hydroquinone sulfonate); 1-phenyl-3-pyrazolidinone; 4-alkylated 1-phenyl-3-pyrazolidinone; (such as 1-phenyl-4-methyl-3-pyrazolidinone or 1-phenyl-4,4-dimethyl-3-pyrazolidinone); and mixtures of 1-phenyl-3-pyrazolidinone and a dihydroxy benzene such as catechol, resorcinol or hydroquinone.

It has been discovered that hydroquinone-3-sulfonate, sodium salt, when incorporated in the bath in an amount of about 0.30 gm/l reduces the topography of plated metal or alloy from large granules to smaller ones as defined by the grain boundaries, and a smoother surface is realized which can be visualized by scanning electron microscopy. The change in the surface characteristics of the plated metal or alloy obtained from a bath in which the sodium hydroquinone sulfonate is incorporated in the bath composition is a distinct improvement over the prior art. The hydroquinone sulfonate, particularly the sodium hydroquinone, is also an excellent inhibitor of the oxidation of stannous tin by aerobic oxidation.

Other antioxidants were discovered to be similarly useful. An unexpected result of the present invention was the discovery of a new group of antioxidants capable of inhibiting the aerobic oxidation of stannous tin without having an adverse effect on the electrodeposits of tin or tin lead alloys. These compounds are nitrogen heterocyclics represented by 1-phenyl-3-pyrazolidinone (I), 1-phenyl-4-methyl-3-pyrazolidinone (II), and 1-phenyl-4,4-dimethyl-3 pyrazolidinone (III):

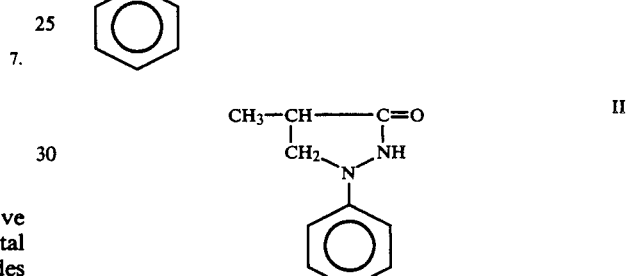

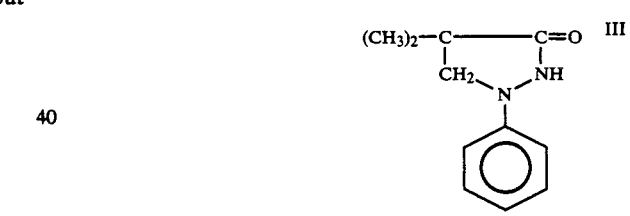

The nitrogen heterocyclics when incorporated into tin lead alloy plating baths at concentrations of about 0.2 gm/l do not have substantial adverse effects on the plating characteristics of the bath, yet function to inhibit unwanted oxidation of stannous tin to the tetravalent state.

It has further unexpectedly been discovered that 1-phenyl-3-pyrazolidinone may be combined with dihydric phenols, such as hydroquinone, catechol and resorcinol, in electroplating baths to provide an antioxidant effect wherein the amounts of each antioxidant required are significantly lower than the same reagents used singly to prevent the oxidation of divalent tin. Preferably, the 1-phenyl-3-pyrazolidone and dihydric phenol are each present in the bath in an amount of about 0.05 gm/l.

EXAMPLE 1

Electroplating baths were prepared by known methods and provided with tin and lead salts for deposition of a tin/lead alloy. The foaming caused by a common prior art surfactant (50/50 mixture Neodol 91-6 (Shell) and Pluronic 64 (BASF), both of which are hydroxyl-containing nonionic surfactants) were compared to foaming characteristics for five baths which included surfactants which lack a terminal hydroxyl group in accordance with the invention. The experimental details and results are shown below in Table 1. The foam was generated by aeration.

TABLE 1

EFFECT OF MODIFIED NONIONIC SURFACTANTS ON FOAMING PROPERTIES OF Sn/Pb METHANE SULFONATE BATH[1]

| Additive | Additive gm/l | Sn gm/l | Pb gm/l | MSA gm/l | Foam Height initial | Foam Height after 5 min. |
|---|---|---|---|---|---|---|
| Control[2] | 1.8 | 20 | 10 | 178 | 30.5 cm | 21.5 cm |
| Triton DF-12 (An etherified nonionic) | 1.8 | 20 | 10 | 178 | 9.5 cm | 0 |
| Triton DF-18 (An etherified nonionic) | 1.8 | 20 | 10 | 178 | 20.5 cm | 0 |
| Triton CF-76 (Acetal-type non-ionic surfactant) | 1.8 | 20 | 10 | 178 | 20.5 cm | 7.5 cm |
| Antarox LF-330 (An etherified nonionic) | 1.8 | 20 | 10 | 178 | 17.5 cm | 0.5 cm |
| Avanel N-1525 (Nonionic with halo Substitution in place of terminal hydroxy) | 1.8 | 20 | 10 | 178 | 28.3 cm | 13.0 cm |

[1]Foam generated by air going through a sintered glass at the rate of 900 ml./min. Total volume of Sn/Pb plating solution 100 ml. Diameter of tube = 7.5 cm. Foam height measured in centimeters.
[2]$C_{13}$ alcohol plus 9 moles of ethylene oxide (50%) and Pluronic L64 (BASF Wyandotte) (50%). This blend of nonionics is typical of prior art surfactants commonly used in Sn/Pb plating.

EXAMPLE 2

Tin/lead electroplating baths were prepared as shown below in Table 2. A workpiece having the indicated composition and geometry was electroplated in the bath under the conditions indicated in Table 2. Plate thickness was measured at various points by X-ray fluorescence. Variations in the deposit are as indicated in the Table.

TABLE 2

EFFECT OF HETEROAROMATICS ON THE ELECTRODEPOSITION OF A 60/40 Sn—Pb ALLOY AND THE VARIATION IN THICKNESS OF THE DEPOSIT WITH CURRENT DENSITY[1]

| Heteroaromatic | Additive gm/l | Pb gm/l | Sn gm/l | MSA gm/l | Sn content % | Variance | Variation in deposit thickness (microinches) 12–60 amps/ft[2] | Appearance of Plate #1 |
|---|---|---|---|---|---|---|---|---|
| Control[2] | 0 | 15.4 | 21 | 170 | 58.9 | ±3.4% | 350 | white matte |
| Phenanthroline[2] | 0.0075 | 15.4 | 21 | 170 | 60.6 | ±1.9% | 124 | white/grey matte |
| 2,2'-bipyridyl[2] | 0.020 | 15.4 | 19.5 | 170 | 62.4 | ±0.98% | 193 | white matte |
| 2,9-dimethyl[2] phenanthroline | 0.005 | 14.0 | 21.0 | 170 | 60.0 | ±2.0% | 313 | white/grey matte |
| 1:1 mixture of phenanthroline and bipyridyl[2] | 0.0175 | 14.0 | 21.0 | 170 | 59.1 | ±1.9% | 67 | white/grey matte |

[1]Tests were carried out in 267 ml. Hull cells, with agitation, at room temperature, and at 2 amps for 5 minutes. Tin and lead methane sulfonate were used as electrolyte. Substrates: 4½" × 2½" brass panels.
[2]All plating solutions contained a 5% nonionic surfactant which comprised a 1:1 mixture of Pluronic L64 and Avanel N-1525.

Brass panels were used to test electroplating baths containing the novel dioxolane brighteners of the invention. The specific bath formulations, experimental details and results are reported below.

EXAMPLES 3 AND 4

| Bath Composition | Bath 3 | Bath 4 |
|---|---|---|
| Tin methane sulfonate (as Sn) | 54 gms/l. | 54 gms/l. |
| Lead methane sulfonate (as Pb) | 6 gms/l. | 6 gms/l. |
| 70% methane sulfonic acid | 177 gms/l. | 177 gms/l. |
| Pluronic L-64 | 2.0 gms/l. | 2.0 gms/l. |
| 2-methyl dioxolane | 55 gms/l. | 55 gms/l. |
| 1,2-dioxolane | 0 | 10 gms/l. |

Plating conditions: 267 ml Hull cell/brass panels
Temperature: (20°–23° C.)
Agitation: Magnetic stirring bar
Current: 5 amps
Time: 2 minutes

Appearance of Deposits

Bath 3: A white semi-bright deposit over two-thirds of the panel.

Bath 4: A smooth mirror-bright deposit over one-half the panel.

EXAMPLE 5

| Bath Composition | Bath 5 |
|---|---|
| Tin methane sulfonate (as Sn) | 54.0 gms/l. |
| Lead methane sulfonate (as Pb) | 6.0 gms/l. |
| 70% methane sulfonic acid | 177 gms/l. |
| Pluronic L-43 | 1.5 gms/l. |
| Alvanel N-1525 | 3.5 gms/l. |
| 2-methyl 4-hydroxymethyl dioxolane | 30 gms/l. |
| 4-hydroxymethyl 2-chlorophenyl dioxolane | 0.5 gms/l. |

Plating conditions: 267 Hull cell/4½":×2/12" brass panel
Temperature: (20°–23° C.)
Agitation: Magnetic stirring bar
Current: 5 amps
Time: 2 minutes

Appearance of Deposit

Bath 5: A mirror-bright finish covering two-thirds of the panel.

EXAMPLES 6 AND 7

| Bath Composition | Bath 6 | Bath 7 |
|---|---|---|
| Tin methane sulfonate (as Sn) | 21.0 gms/l. | 21.0 gms/l. |
| Lead methane sulfonate (as Pb) | 15.4 gms/l. | 15.4 gms/l. |
| Methane Sulfonic acid | 177 gms/l. | 177 gms/l. |
| Pluronic L-43 | 1.5 gms/l. | 1.5 gms/l. |
| Avanel N-1525 | 3.5 gms/l | 3.5 gms/l. |
| Phenanthroline | 0.008 gms/l. | 0.008 gms/l. |
| 1,3-dioxolane | 0 | 10 gms/l. |
| 2-methyl 1,3-dioxolane | 0 | 25 gms/l. |
| 4-hydroxymethyl 2-chlorophenyl dioxolane | 0 | 0.01 gms/l. |

Plating conditions: 267 ml Hull cell/4½"×2½" brass panel
Temperature: (20°–23° C.)
Agitation: Magnetic stirring bar
Current: 2 amps
Time: 5 minutes

Appearance of Deposits

Bath 6: The tin-lead plate was a white matte finish covering 90% of the panel.

Bath 7: The tin-lead plate had a mirror-bright finish covering 60% of the panel from 10 amps/ft$^2$ to 70 amps/ft$^2$

EXAMPLE 8

Semi-Bright Sn/Pb Plating Bath

| Semi-Bright Sn/Pb Plating Bath | |
|---|---|
| Tin methane sulfonate | 51.6 gms/liter |
| Lead methane sulfonate | 18.1 gms/liter |
| Avanel N-1525 | 1.0 gms/liter |
| Phenanthroline | 0.03 gms/liter |
| 2,2'-dipyridyl | 0.03 gms/liter |
| 2-(2'-chlorphenyl) 4-hydroxymethyl 1,3-dioxalane) | 0.006 gms/liter |

A brass Hull cell panel was plated in a 267 ml Hull cell at 5 amps for 1 minute.
A semi-bright plate was obtained from 250 amps/ft.$^2$ to 60 amps/ft.$^2$.

EXAMPLE 9

| | |
|---|---|
| Tin methane sulfonate | 20 gm/l (as metallic tin) |
| Lead methane sulfonate | 13 gm/l (as metallic lead) |
| 70% Methane sulfonic acid | 150 ml/l |
| Nonionic surfactant blend | 50 gm/l |
| Potassium hydroquinone sulfonate | 0.3 gm/l |

267 ml. of the above solution was plated in a Hull cell on a brass panel for five minutes at two amperes. The deposit was a white matte showing an approximately uniform alloy content over a current density from 20–200 amps/ft2.

EXAMPLE 10

| | |
|---|---|
| Tin methane sulfonate | 20 gm/l (as metallic tin) |
| Lead methane sulfonate | 13 gm/l (as metallic lead) |
| 70% Methane sulfonic acid | 150 ml/l |
| Nonionic surfactant blend | 50 gm/l |
| 1-phenyl-3-pyrazolidinone | 0.2 gm/l |

267 ml. of the above solution was plated in a Hull cell on a brass panel for five minutes at two amperes. The deposit was a white matte showing a uniform alloy content over a current density from 20–200 amps/ft2.

EXAMPLE 11

| | |
|---|---|
| Tin methane sulfonate | 20 gm/l (as metallic tin) |
| Lead methane sulfonate | 13 gm/l (as metallic lead) |
| 70% Methane sulfonic acid | 150 ml/l |
| Nonionic surfactant blend | 50 gm/l |
| 1-phenyl-3-pyrazolidinone | 0.05 gm/l |
| Potassium hydroquinone sulfonate | 0.05 gm/l |

267 ml. of the above solution was plated in a Hull cell on a brass panel for five minutes at two amperes. The deposit was a white matte showing a uniform alloy content over a current density range from 20–200 amps/ft2.

EXAMPLE 12

| | |
|---|---|
| Tin methane sulfonate | 20 gm/l (as metallic tin) |
| Lead methane sulfonate | 13 gm/l (as metallic lead) |
| 70% Methane sulfonic acid | 150 ml/l |
| Nonionic surfactant blend | 50 gm/l |
| 1-phenyl-4-methyl-3-pyrazolidinone | 0.2 gm/l |

267 ml. of the above solution was plated in a Hull cell on a brass panel for five minutes at two amperes. The deposit was a white matte showing a uniform alloy content over a current density from 20–200 amps/ft2.

EXAMPLE 13

| | |
|---|---|
| Tin methane sulfonate | 20 gm/l (as metallic tin) |
| Lead methane sulfonate | 13 gm/l (as metallic lead) |
| 70% Methane sulfonic acid | 150 ml/l |
| Nonionic surfactant blend | 50 gm/l |
| 1-phenyl-3-pyrazolidinone | 0.05 gm/l |
| Catechol (0-dihydroxybenzene) | 0.05 gm/l |

267 ml. of the above solution was plated in a Hull cell on a brass panel for five minutes at two amperes. The deposit was a white matte showing a uniform alloy content over a current density range from 20–200 amps/ft2.

The terms and descriptions used herein are preferred embodiments set forth by way of illustration only, and are not intended as limitations on the many variations which those of skill in the art will recognize to be possible in practicing the present invention as defined by the following claims.

What is claimed is:

1. An electroplating bath comprising water-soluble tin and lead salts and an amount of an antioxidant effective to suppress oxidation of divalent tin in the bath, said antioxidant being selected from the group consisting of hydroquinone sulfonate, 1-phenyl-3-pyrazolidinone and 4-alkylated 1-phenyl-3-pyrazolidinone.

2. The electroplating bath according to claim 1, wherein the antioxidant is hydroquinone sulfonate.

3. The electroplating bath according to claim 2, wherein the hydroquinone sulfonate is selected from the group consisting of potassium hydroquinone sulfonate and sodium hydroquinone sulfonate.

4. The electroplating bath according to claim 3, wherein the hydroquinone sulfonate is potassium hydroquinone sulfonate.

5. The electroplating bath according to claim 3, wherein the hydroquinone sulfonate is sodium hydroquinone sulfonate.

6. The electroplating bath according to claim 1, wherein the antioxidant is 1-phenyl-3-pyrazolidinone.

7. The electroplating bath according to claim 6, further comprising an additional antioxidant, the antioxidant and additional antioxidant being effective to prevent oxidation of divalent tin in the bath, said additional antioxidant comprising a dihydric phenol compound.

8. The electroplating bath according to claim 7, wherein the dihydric phenol compound is selected from the group consisting of catechol, resorcinol and hydroquinone.

9. The electroplating bath according to claim 8, wherein the dihydric phenol alcohol is catechol.

10. The electroplating bath according to claim 8, wherein the dihydric phenol is resorcinol.

11. The electroplating bath according to claim 8, wherein the dihydric phenol is hydroquinone.

12. The electroplating bath according to claim 1, wherein the antioxidant is 4-alkylated 1-phenyl-3-pyrazolidinone.

13. The electroplating bath according to claim 12, wherein the 4-alkylated 1-phenyl-3-pyrazolidinone is selected from the group consisting of 1-phenyl-4-methyl-3-pyrazolidinone and 1-phenyl-4,4-dimethyl-3-pyrazolidinone.

14. The electroplating bath according to claim 13, wherein the antioxidant is 1-phenyl-4-methyl-3-pyrazolidinone.

15. The electroplating bath according to claim 13, wherein the antioxidant is 1-phenyl-4,4-dimethyl-3-pyrazolidinone.

16. The electroplating bath according to claim 1, wherein the amount of antioxidant is not more than about 0.3 grams/liter.

17. An electroplating process, comprising the step of contacting an electroplatable object with an electroplating bath as claimed in claim 1.

18. The electroplating process according to claim 17, wherein the process results in a substantial reduction of oxidation of divalent tin present in the bath.

19. The electroplating process according to claim 17, wherein the amount of antioxidant is not more than about 0.3 grams/liter.

* * * * *